United States Patent [19]

Greig

[11] 4,038,611
[45] July 26, 1977

[54] VARIABLE ON-AND OFF-TIME RELAXATION OSCILLATOR

[76] Inventor: Douglas J. Greig, 30053 Del Lane, Warren, Mich. 48091

[21] Appl. No.: 661,849

[22] Filed: Feb. 27, 1976

[51] Int. Cl.² ............................................. H03K 3/02
[52] U.S. Cl. ................................. 331/108 D; 331/111; 331/150; 331/177 R
[58] Field of Search ........... 331/111, 143, 150, 177 R, 331/108 D

[56] References Cited

U.S. PATENT DOCUMENTS 3,763,322  10/1973  Garcia et al. .................... 331/111 X

OTHER PUBLICATIONS

Kovach et al., "Simple Precision RC Oscillator", IBM Technical Disclosure Bulletin, vol. 16, No. 10, Mar. 1974, pp. 3174, 3175.

*Primary Examiner*—Siegfried H. Grimm
*Attorney, Agent, or Firm*—Arnold S. Weintraub

[57] ABSTRACT

A relaxation oscillator comprising three cascaded operational voltage comparators is described. The on-time of the inventive circuit is established in accordance with a variable input element to the first operational comparator. The off-time is established by an RC network in the input circuit of the second operational comparator. The first and second operational comparators are interconnected so that the turning on or off of the second operational comparator affects the first operational comparator to cause it to also turn on or off.

7 Claims, 1 Drawing Figure

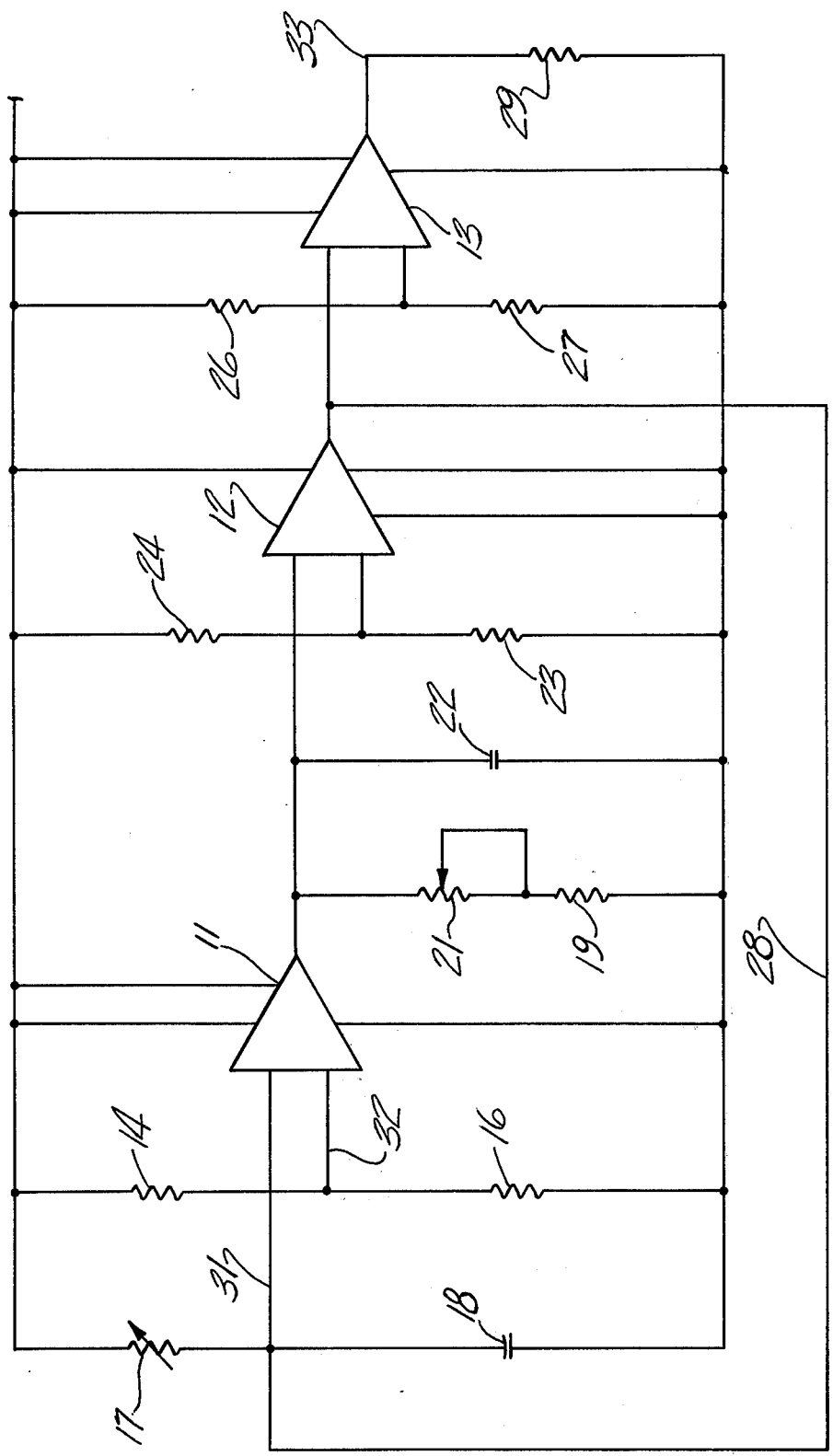

VARIABLE ON-AND OFF-TIME RELAXATION OSCILLATOR

BACKGROUND OF THE INVENTION

There are varied needs within the art for an operational voltage comparator in which the off-time is variable without affecting the on-time. There is also a need for such a circuit in which the off-time is not affected by the on-time. Thus, the need for a relaxation oscillator in which the on and off time are independently variable is presently recognized in the art and efforts at arriving at such a circuit have not presently met with commercial and operational success.

SUMMARY OF THE INVENTION

The invention is directed to a variable off-time relaxation oscillator in which three operational voltage comparators are cascaded and interconnected such that the application of an input signal to the first comparator causes the second comparator to be immediately turned on and the third comparator to be immediately turned off. The output of the second comparator is connected back to the input of the first comparator so that the first operational comparator is immediately turned off upon the turning on of the second comparator. However, the second operational comparator remains off, because an RC discharge network in the input circuit maintains a voltage on the input of the second comparator until the capacitor within the RC network discharges. After the discharge of the capacitor the second operational comparator turns off, this then causes the first RC network to build up a charge to turn on the first comparator, thereby repeating the process. The third operational comparator inversely follows the second operational comparator. Because the first and third operational comparators are independent, the on-time and off-time of the inventive relaxation oscillator are independently variable.

BRIEF DESCRIPTION OF THE DRAWING

The FIGURE is a preferred embodiment of the invention.

DETAILED DESCRIPTION OF THE INVENTION

At the outset it should be noted that as used herein the term "voltage comparator" defines an Operational amplifier having a transistor built thereinto. Thus, the terms voltage comparator and amplifier are interchangeable as used herein and define a voltage comparator.

As shown in the FIGURE, the circuit includes three voltage comparators 11, 12 and 13. One input terminal of comparator 11 is connected to the junction of two resistors 14 and 16 while the other input terminal is connected to the junction of a potentiometer 17 and a capacitor 18. Accordingly, the on-time of comparator 11 can be adjusted by adjusting the potentiometer 17.

The output of comparator 11 is connected to one of the input terminals of operational amplifier 12. Connected between this input terminal and ground is an RC network comprised of resistor 19 and potentiometer 21 in parallel with a capacitor 22. The other input terminal of operational amplifier or comparator 12 is connected to the junction of resistors 23 and 24.

The output terminal of amplifier 12 is connected to one of the input terminals of operational amplifier 13. The other input terminal of operational amplifier 13 is connected to the junction of two resistors 26 and 27. The output terminal of operational amplifier 12 is connected to the junction of resistor 17 and capacitor 18. This junction is connected to one of the input terminals of operational amplifier 11. It should be noted that, with respect to the inputs amplifiers 11 and 12 generate output signals in response to input signals having similar polarities with respect to a reference or fixed potential and, therefore, may be referred to as being similarly poled, while amplifier 13 generates an output signal in response to an input signal having an opposite polarity with respect to the inputs to amplifiers 11 and 12 and, therefore, the input to amplifier 13 may be referred to as being oppositely poled from amplifiers 11 and 12. With respect to the outputs, comparators 11 and 13 generate output signals which have similar polarities with respect to a reference potential and therefore, may be referred to as being similarly poled while comparator 12 generates an output in response to an input which is of the opposite polarity of the outputs generated by comparators 11 and 13 and, therefore, the output of comparator 12 may be referred to as being oppositely poled from comparators 11 and 13. The output 33 of comparator 13 is biased by a resistance 29 having one end connected in common, such as a common potential or a common ground with resistances 16, 19, 23 and 27.

In operation, when the voltage present on input terminal 31 of operational amplifier 11 exceeds the voltage present on input terminal 32 operational amplifier 11 turns on. Accordingly, the on-time of the inventive circuit can be varied by varying potentiometer 17 in accordance with fixed values of resistors 14 and 16. When operational amplifier 11 turns on, the output voltage is immediately applied to the input of operational amplifier 12 causing this comparator to turn on. The output of amplifier 12 is applied to an input terminal of operational amplifier 13 so that this operational amplifier immediately turns off. Accordingly, the off-time of the inventive circuit is determined by the on-time of amplifier 12. The output signal of operational amplifier 12 is fed back to input terminal 31 of operational amplifier 11 so that turning on the amplifier 12 causes amplifier 11 to immediately turn off. The turning off of operational amplifier 11 removes the input signal which initially caused operational amplifier 12 to turn on. However, operational amplifier 12 remains on until the capacitor 22 in the RC network formed by resistor 19, potentiometer 21 and capacitor 22 discharges. The discharge of capacitor 22 is dependent upon the set value of potentiometer 21. Accordingly, the on-time of operational amplifier 12 is dependent upon the setting of the potentiometer 21, and because amplifier 13 is off when amplifier 12 is on, the off-time of the inventive circuit is set by the adjustment of potentiometer 21.

As soon as capacitor 22 discharges an amount sufficient to cause operational amplifier 12 to turn off, the input voltage applied to terminal 31 of operational amplifier 11 is sufficiently low and amplifier 11 stays off until the RC network defined by potentiometer 17 and capacitor 18 builds up a charge equal to or greater than the fixed value defined by resistors 14 and 16, at which time comparator 11 turns on, thus, repeating the entire process. The turning off of amplifier 12 also causes amplifier 13 to turn on. As soon as operational amplifier 11 turns back on, operational amplifier 12 is, also, turned on and amplifier 13 turned off.

It should be understood that because amplifier 11 and 13 are poled differently from amplifier 12, with respect to their outputs, there is no output from operational amplifier 13 as long as operational amplifier 12 is on. Therefore, the removal of the output signal of operational amplifier 12 by the discharge of the capacitor 22 causes operational amplifier 13 to turn on. Accordingly, the off-time of the output signal from the inventive circuit on lead 33 is readily varied simply by varying the potentiometer 21 which establishes the time constant of the RC network which is connected to the input of operational amplifier 12. Also, the on-time of the inventive circuit is variable simply by varying potentiometer 17 connected to the input terminal of operational amplifier 11.

Having, thus, described the invention what is claimed is:

1. A variable on-and off-time relaxation oscillator comprising:
    a plurality of dual input terminal electron control means connected in cascade for generating outputs of predetermined polarities in response to inputs;
    variable impedance means connected to one input terminal of a first of said electron control means;
    first fixed impedance means connected to the other input terminal of said first electron control means;
    the output terminal of said first electron control means being connected to one input terminal of a second of said electron control means, a resistance-capacitance network connected to said one input terminal of said second electron control means;
    second fixed impedance means connected to the other input terminal of said second electron control means;
    the output terminal of said second electron control means being connected to an input terminal of a third electron control means, the polarity of the output of said second electron control means being the opposite of the polarity of said first and third electron control means;
    third fixed impedance means connected to the other input terminal of said third electron control means;
    the output terminal of said second electron control means being coupled to said one input terminal of said first electron control means so that an output signal on the output terminal of said second electron control means causes said first and third electron control means to be turned off and said resistance-capacitance network controls the off-time of said variable on-and off time relaxation oscillator.

2. The oscillator of claim 1 wherein said electron control means are operational voltage comparators.

3. The circuit of claim 1 wherein said resistance-capacitance network includes a capacitor in parallel with a serial combination of a potentiometer and a resistance.

4. The circuit of claim 2 wherein said resistance-capacitance network includes a capacitor in a parallel with a serial combination of a potentiometer and a resistance.

5. A variable on-and off-time relaxation oscillator comprising three cascaded operational amplifiers having alternately poled outputs:
    a first input terminal of a second of said operational amplifier being coupled to the output terminal of a first of said operational amplifiers, the output terminal of said second operational amplifier being coupled to a first input of said first operational amplifier, means biassing the second inputs of said first and second operational amplifiers so that said first operational amplifier is turned off when said second amplifier is turned on;
    one input terminal of said third operational amplifier being coupled to the output terminal of said second operational amplifier and the other input terminal of said third operational amplifier being biassed so that said third operational amplifier is off when said second operational amplifier is on; and
    means for varying the on-time of said first and second operational amplifiers to thereby vary the on-time and off-time of said third operational amplifier.

6. The oscillator of claim 5 wherein said means for varying is a resistance-capacitance network.

7. The oscillator of claim 6 wherein said resistance-capacitance network includes a capacitor in paralled with a serial connection of a potentiometer and a resistor.

* * * * *